United States Patent [19]

Haken

[11] Patent Number: 4,590,663

[45] Date of Patent: * May 27, 1986

[54] HIGH VOLTAGE CMOS TECHNOLOGY WITH N-CHANNEL SOURCE/DRAIN EXTENSIONS

[75] Inventor: Roger A. Haken, Richardson, Tex.

[73] Assignee: Texas Instruments Incorporated, Dallas, Tex.

[*] Notice: The portion of the term of this patent subsequent to Apr. 17, 2001 has been disclaimed.

[21] Appl. No.: 469,074

[22] Filed: Feb. 23, 1983

Related U.S. Application Data

[63] Continuation-in-part of Ser. No. 344,588, Feb. 1, 1981, Pat. No. 4,442,591.

[51] Int. Cl.4 .................. H01L 21/265; H01L 21/76
[52] U.S. Cl. .................................... 29/571; 29/576 B; 29/577 C; 29/578; 148/1.5
[58] Field of Search ............... 29/571, 578, 576 B, 29/576 E, 577 C; 148/1.5; 357/42, 44

[56] References Cited

U.S. PATENT DOCUMENTS

| | | | |
|---|---|---|---|
| 4,356,623 | 11/1982 | Hunter | 29/571 |
| 4,366,613 | 1/1983 | Ogura et al. | 29/577 C |
| 4,406,049 | 9/1983 | Tam et al. | 29/577 C |
| 4,419,809 | 12/1983 | Riseman et al. | 29/571 |
| 4,442,591 | 4/1984 | Haken | 29/571 |

OTHER PUBLICATIONS

Ogura et al., "Design and Characteristics of the Lightly Doped Drain-Source (LDD) Insulated Gate FET", IEEE Trans., vol. ED-27, No. 8, Aug. 1980.

*Primary Examiner*—Brian L. Hearn
*Assistant Examiner*—Hunter L. Auyang
*Attorney, Agent, or Firm*—Robert Groover, III; Douglas A. Sorensen; Melvin Sharp

[57] ABSTRACT

N-channel devices are fabricated with lightly doped drain/source extensions in a CMOS process, without the requirement of an extra mask level. A merged mask technique uses an oversized version of the N-channel gates, expanded by two alignment tolerances per side, combined with the regular N+ source/drain mask. The oversized gate photoresist prevents the heavy N+ source/drain implant from counterdoping the previously introduced lightly doped drain blanket implant. In the P-channel regions the N-type LDD extensions are counterdoped by the regular P+ source/drain implant. This high-voltage process provides 20 V parts with 4 micron geometries, scalable to other voltages.

10 Claims, 15 Drawing Figures (A) REGULAR $A_S$ S/D IMPLANT $\sim 1 \times 10^{16}$/CM$^2$
- FIELD INDUCED DRAIN BREAKDOWN AT $V_D = 13V$ (B) LDD DEVICE USING PHOSPHORUS, $8 \times 10^{12}$/CM$^2$, PLUS REGULAR AS S/D
- FIELD INDUCED BREAKDOWN AT $V_D = 20V$
- INCREASED S/D RESISTANCE DECREASES GM AND INCREASES $V_{DSAT}$

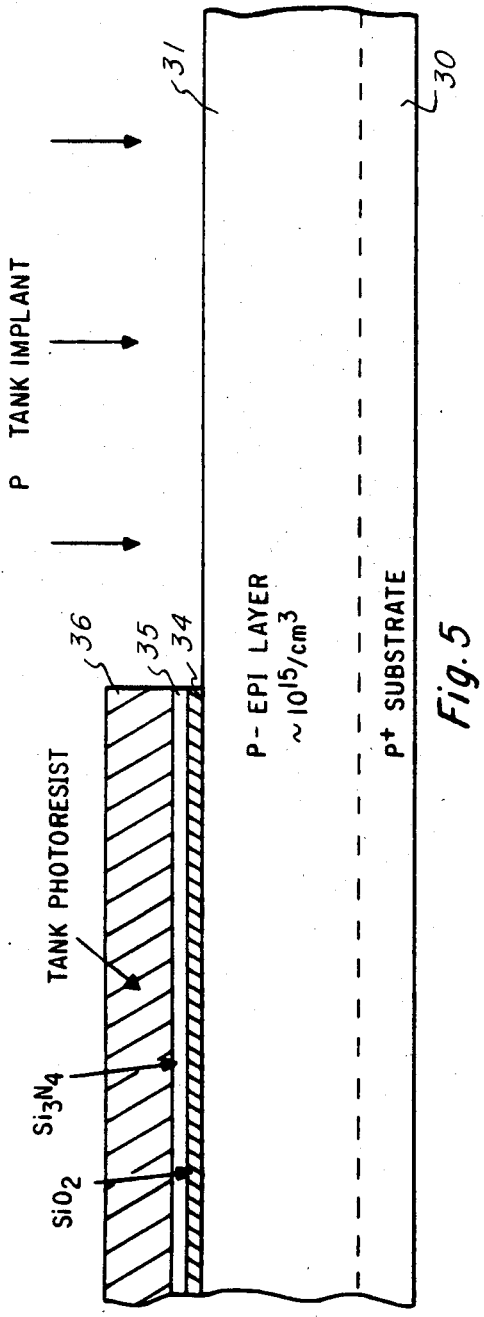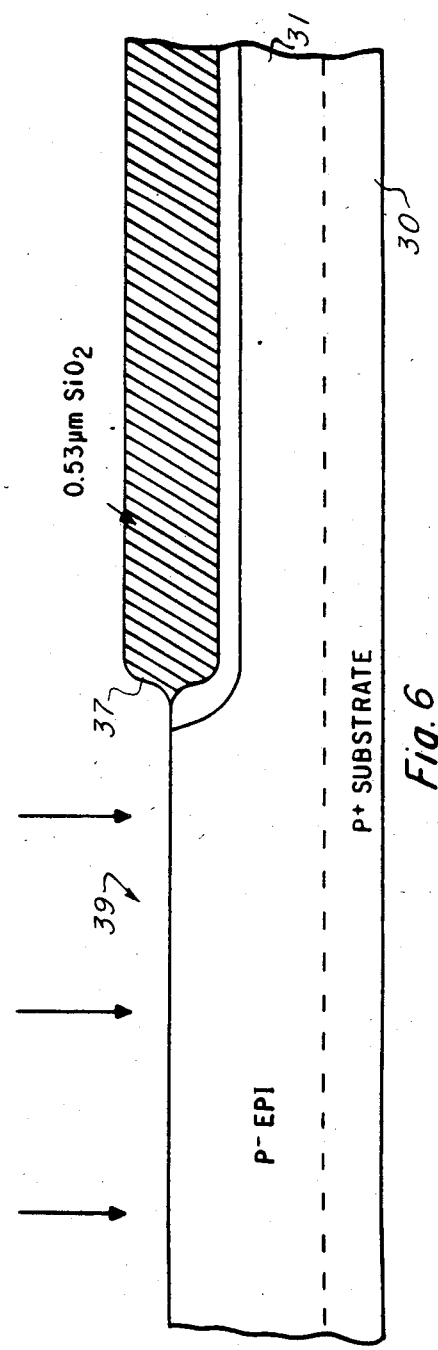

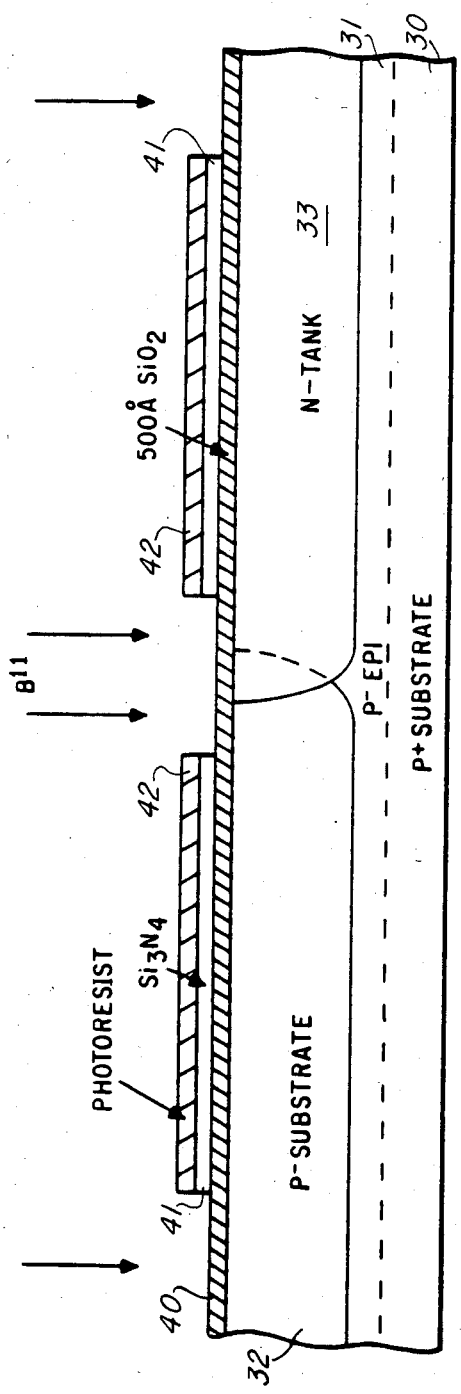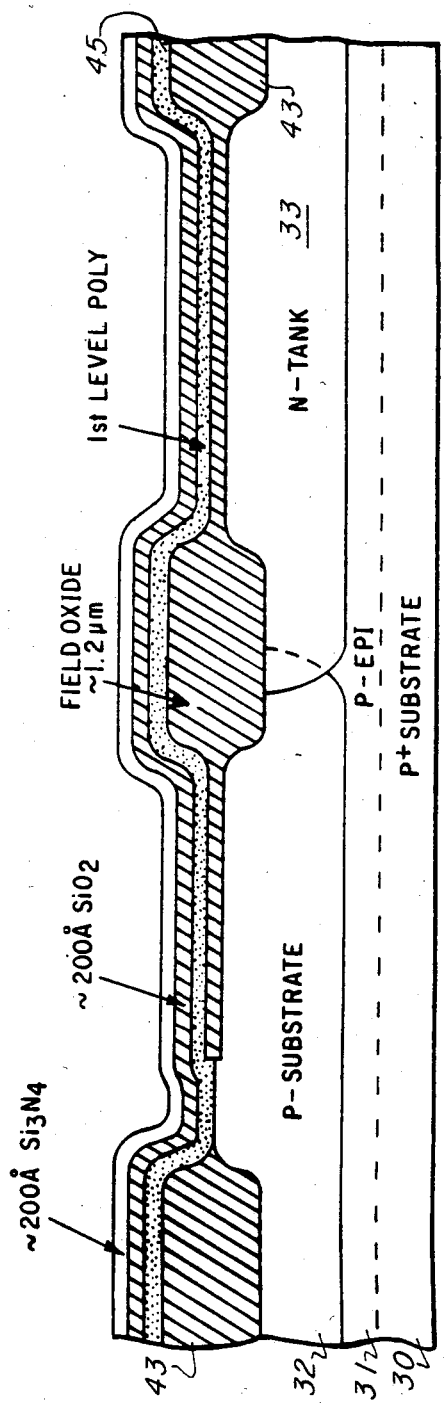

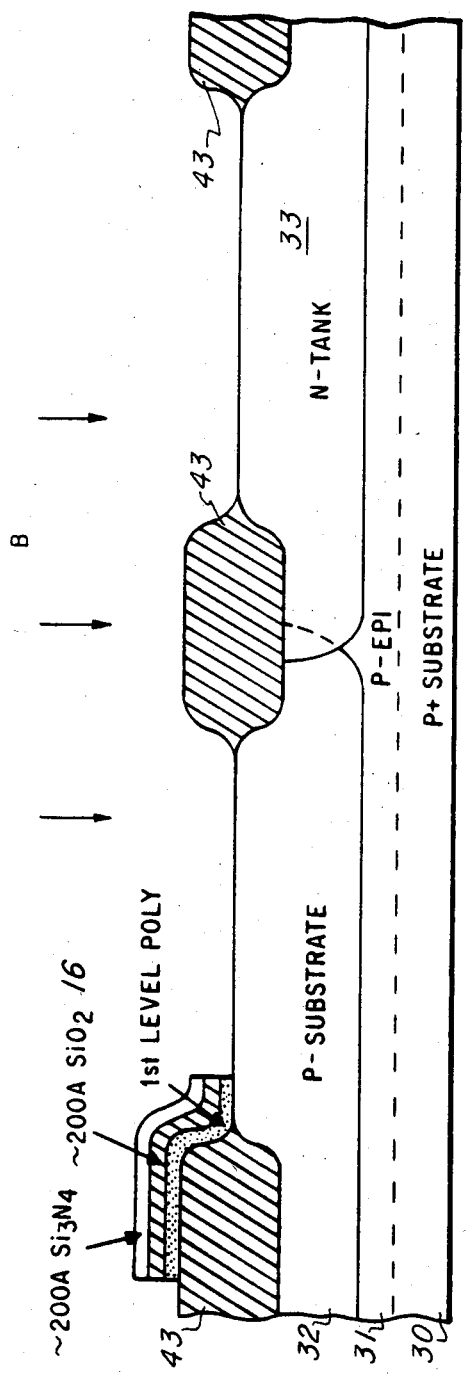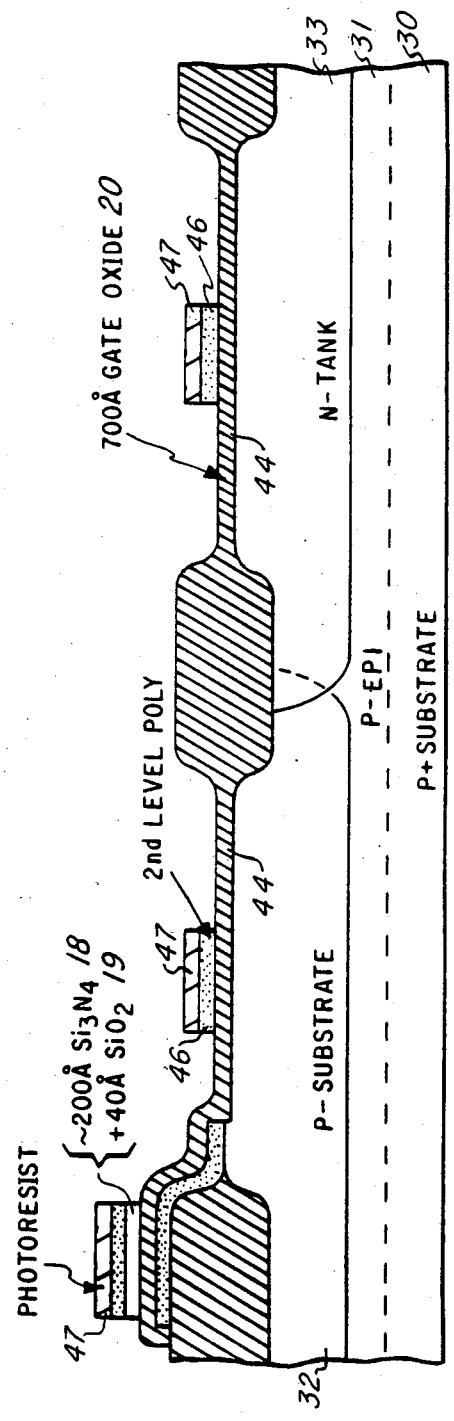
Fig. 9
Fig. 10

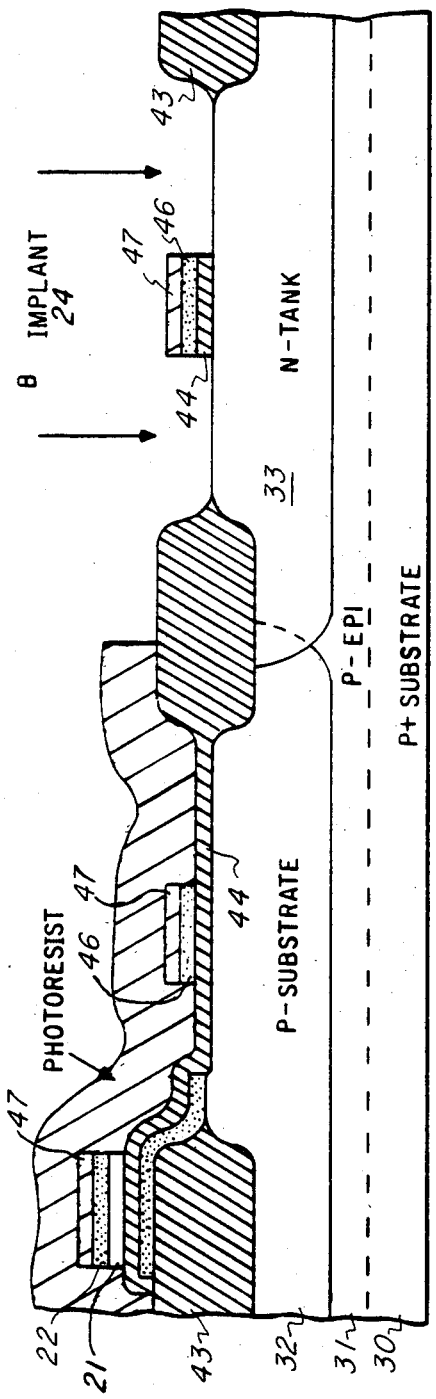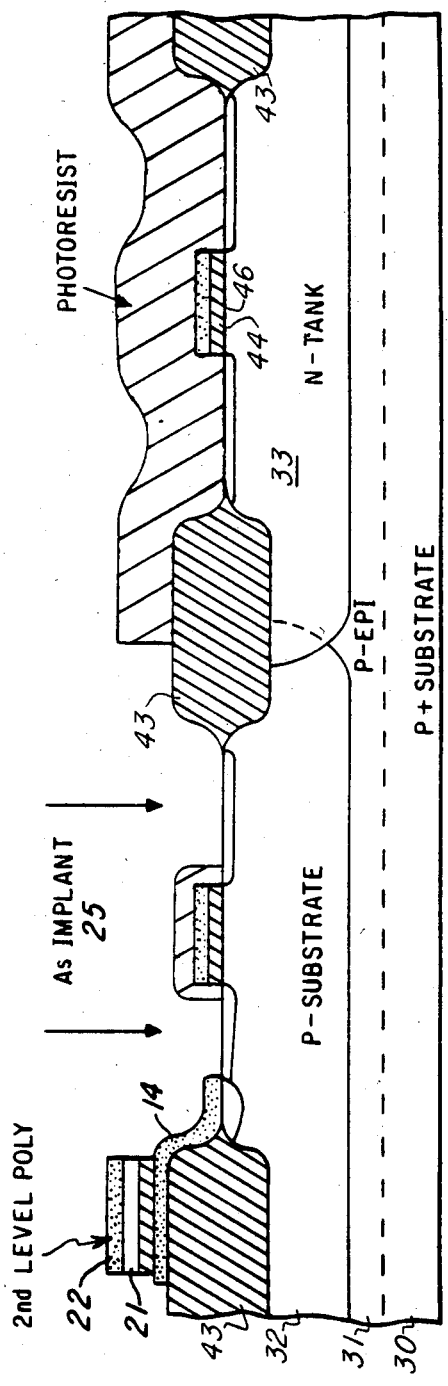

HIGH VOLTAGE CMOS TECHNOLOGY WITH N-CHANNEL SOURCE/DRAIN EXTENSIONS

CROSS REFERENCE TO RELATED APPLICATIONS

The present invention is a continuation in part of U.S. patent application Ser. No. 344,588 now U.S. Pat. No. 4,442,591, "HIGH-VOLTAGE CMOS PROCESS", filed Feb. 1, 1982, which is hereby incorporated by reference.

BACKGROUND AND SUMMARY OF THE INVENTION

The present invention relates to fabrication of high-voltage high-density CMOS integrated circuits.

A limitation to extending CMOS technology to high voltages with short channels, say 20 V and 4 microns, is imposed by gate field induced breakdown of the N-channel drains, hot-electron emission due to impact ionization, and by drain to source punchthrough.

In digital CMOS circuits parasitic substrate currents caused by impact ionization flow during the switching transients when both N and P-channel devices are turned on. This can give rise to 'substrate bounce' which could cause latch-up, debiasing or the discharge of floating nodes. (These are good reasons for using epi on a P+ substrate.) In analog circuits the situation is potentially more serious since N-channel source follower type configurations could be biased such that a significant parasitic substrate current flows continuously. Perhaps the most serious effect of all is hot carrier injection into the gate oxide which can cause long term threshold shifts and transconductance degradation. Of course, all these problems become more severe as the gate oxide is scaled while the supply voltage is kept constant.

Since the coefficient of impact ionization is orders of magnitude higher for electrons than for holes, the above undesirable effects are strongest in the N-channel device, which therefore is the key to realizing short channel devices for high voltage high-density IC applications. The present invention teaches techniques for making the N-channel device in a CMOS process 'hot-carrier resistant'. The inventive techniques result in formation of lightly doped N regions between the channel and the N+ a source/drain regions. This structure spreads the potential gradient at the drain pinch-off region into the N- extension. This reduces the peak electric field, thereby increasing the drain breakdown voltage, reducing impact ionization, and consequently reducing hot-electron emission.

The advantages of such a drain doping profile in reducing impact ionization have been previously published. See Ogura et al, "Design and Characteristics of the Lightly Doped Drain/Source (LDD) Insulated Gate Field Effect Transistor," Solid State Cir. 424 (1980), which is hereby incorporated by reference.

The present invention is innovative in teaching the device parameters which permit use of a lightly doped drain (LDD) doping profile in a very high voltage CMOS process. The present invention is also innovative in teaching an advantageous method for fabrication of lightly doped drain doping profiles in a CMOS technology.

Thus it is an object of the present invention to provide a method for fabrication of high-voltage high-density CMOS integrated circuits.

It is a further object of the present invention to provide a method for fabrication of CMOS integrated circuits in which the N-channel devices comprise lightly doped drain extensions.

It is a further object of the present invention to provide a method for fabrication of high-voltage high-density CMOS integrated circuits in which only the N-channel devices and not the P-channel devices comprise lightly doped drain regions, without introducing any additional masking steps.

One method which has been taught in the literature for fabrication of MOS devices with lightly doped drain regions in use of a reachthrough implant which is partially screened by a sidewall oxide. This provides a lightly doped drain region which is self-aligned to the gate edge. However, one important difficulty of sidewall oxide methods is that, unless an additional mask is added, sidewall oxide methods are inherently nonselective. That is, all devices of the type exposed (e.g. all N-channel devices, or all devices on the chip) will receive sidewall oxides, and will therefore be formed with lightly doped drain regions. This inability to selectively provide lightly doped drain regions is disadvantageous, since it cuts out several design alternatives. First, as will be discussed, lightly doped drain regions impose a substantial penalty in transconductance (source resistance) and in total series resistance. Devices which are not exposed to a high source/drain voltage would not need the LDD structure to achieve small geometries, and, if they did not have the LDD structure, could avoid the transconductance and series resistance penalties. Thus, it would be desirable for the circuit designer to have the option of providing more than one operating voltage on the chip. It can also be useful, where both analog and digital circuits are formed on the same chip, to make use of the lightly doped drain structures selective. For example, the analog circuits may need to withstand a substantially higher peak voltage than the digital circuits do.

Thus it is an object of the present invention to provide a method for forming lightly doped drain structures selectively in some but not all N-channel devices in a CMOS high-voltage process, without requiring any additional masking levels.

It should be noted that the function of lightly doped drain structure is substantially different in high voltage devices than in the VLSI approaches discussed, e.g., in the Ogura et al paper cited above. In VLSI applications, the lightly doped drain structure is of primary importance in avoiding substrate parasitic current, and also in minimizing hot carrier injection into the gate oxide. By contrast, in a high-voltage process the key question is not suppression of parasitic currents, but simply the capability to use a reasonably short channel at all. That is, the problem in high-voltage applications is to achieve (e.g.) 4 micron channel length in a functional device of any kind, whereas the problem in VLSI applications is to minimize the parasitic substrate current in (e.g.) a 1¼ micron channel length device.

Thus it is an object of the present invention to provide a CMOS technolgy having high-voltage short-channelling functional devices.

To achieve these and other objects of the invention, the present invention uses a blanket implant (preferably phosphorus) to form the lightly doped drain extension.

This implant is performed after the gate level has been formed, and is preferably done with the photoresist which was used for patterning the gate level still in place. The LDD implant is counterdoped, in the PMOS devices, by the P+ source drain implant, but this LDD implant will form the lightly doped drain extension regions whereever it is not swamped by the N+ source/drain implant or counterdoped by the P+ source/drain implant. The N+ source/drain regions are then patterned. The mask used at this step leaves photoresist not only over the N-tank regions, but also over the gate levels of selected N-channel devices. These N-channel devices, and no others, wind up with lightly doped drain extension regions.

According to the present invention there is provided:

A method for fabricating CMOS integrated circuits, comprising the steps of:

providing a semiconductor substrate having a first conductivity type;

defining a plurality of moat regions on the surface of said substrate;

introducing impurities into the surface of said substrate, to form a plurality of second-type tank regions;

depositing and patterning a first insulated conductive layer to define gates in a predetermind plurality of locations;

introducing a small concentration of an N-type impurity into a shallow surface depth of all exposed regions of said substrate;

introducing a large concentration of a P-type impurity to form P-channel source/drain regions in respective predetermined locations;

forming a masking layer to cover predetermined P-channel devices, and also to cover portions of said first insulated conductive layer in respective predetermined locations of high-voltage N-channel transistors, said masking layer being locally wider than said respective portions of said insulated conductor in said respective locations of said high-voltage N-channel transistors;

introducing a large concentration of an N-type dopant into all exposed surface regions of said substrate to form N-type source/drain regions;

whereby portions of said small-concentration shallow introduction of N-type impurities form LDD regions in said predetermined high-voltage N-channel transistor locations between said respective channel regions of said high-voltage N-channel transistors and said respective source/drain regions thereof;

wherein said high-voltage N-channel transistors each comprise a channel length which is not less than 3 microns.

BRIEF DESCRIPTION OF THE DRAWINGS

The present invention will be described with reference to the accompanying drawings, wherein:

FIGS. 5-13 show the CMOS high-voltage process below preferably used in the present invention.

DESCRIPTION OF THE PREFERRED EMBODIMENTS

Figure 1:
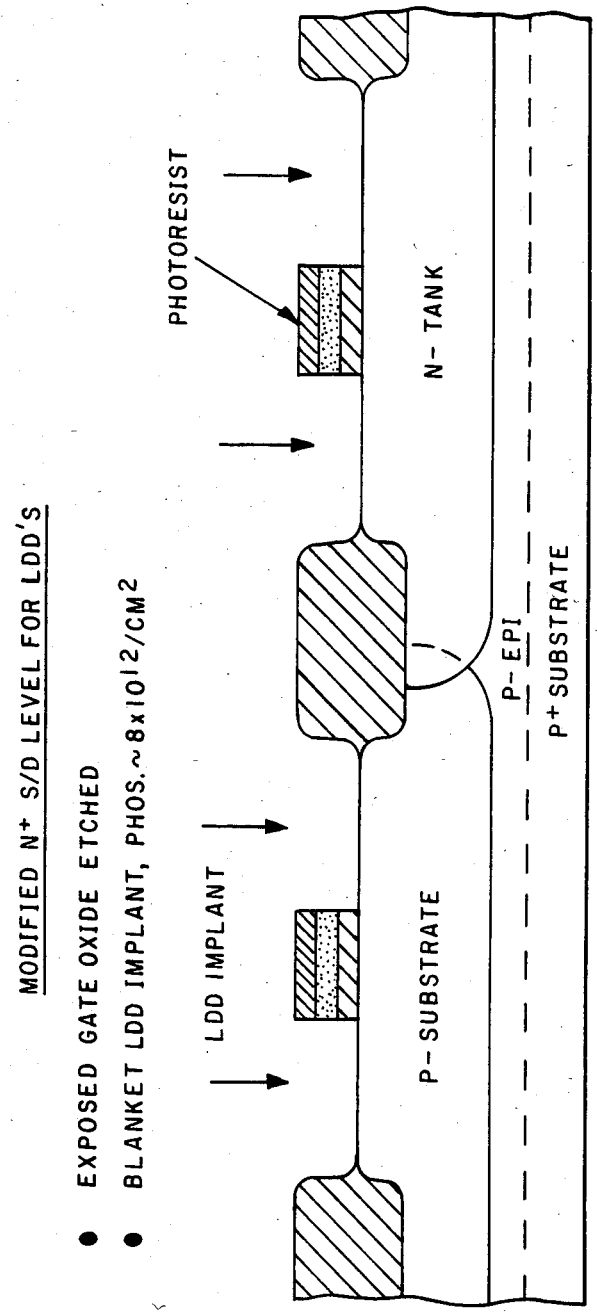
FIGS. 1-3 show crucial process steps in the fabrication of a CMOS integrated circuit which incorporates lightly doped drain regions in selected words of the N-channel devices.

After polysilicon patterning the exposed gate oxide is etched away while the photoresist on the poly is left in place. A light phosphorous or arsenic implant is then performed, e.g. $8 \times 10^{12}/cm^2$ phosphorus at 60 keV, which is self-aligned to the poly gate edge, FIG. 1.

The present invention provides a substantial improvement in high-voltage CMOS processing, which permits fabrication of devices which not only operate well at high voltage but also have very short channel lengths, and therefore can be fabricated with high density. Most of the process flow is identical to that described in U.S. patent application Ser. No. 344,588. However, the innovation of the present invention which permits selective fabrication of lightly doped drain N-channel device in a high-voltage CMOS technology can also be applied to any other high-voltage CMOS process flow. In addition, the basic CMOS process flow of the parent application can also be widely modified and varied.

The key steps which permit formation of the lightly doped drain devices by the method of the present invention will first be reviewed, and then the whole process flow in which these steps are embedded in the preferred embodiment will be discussed.

After patterning of the polysilicon (or first polysilicon) gate level, the process flow is identical to that described in the parent application, and is set forth below.

Phosphorus is believed to be slightly preferable to arsenic for the lightly doped drain implant, since the greater diffusivity of phosphorus will provide a more gradually changing doping profile at the channel/LDD junction.

Use of an LDD implant which includes both arsenic and phosphorus is a further embodiment of the invention, which again provides an even more gradual doping transition at the LDD/channel boundary. That is, since phosphorus has a higher diffusivity than arsenic, a region including only phosphorus will exist just beyond the peripheral of the region containing both phosphorus and arsenic. Again, this spreads the potential and reduces the peak electric field.

In general, the depth and dosage of the LDD implant is selected to achieve a depth in the LDD regions which is somewhat less than the depth of the source regions, and a dopant concentration which is much less than the dopant concentration normally used for a source drain. For example, in the presently preferred embodiment, wherein 4 micron devices are used for 18 volt operation, the dopant concentration in the lightly doped drain regions is approximately 1E14 per cubic centimeter, and the depth of the lightly doped drain region is approximately 0-15-0.2 micron. Deeper LDD regions would work perfectly well (as long as the LDD is not very much deeper than the source/drain depth), but deeper LDD regions impose greater difficulty in control of the lateral diffusion of the LDD implant.

Structurally, the lightly doped drain region serves essentially these functions: first, the change in the dopant profile at the channel/LDD boundary should be gradual. As noted above, this gradual change in the doping profile also implies a more gradual change in the potential, and therefore a reduction in the peak electric field. Second, the heavily doped drain is physically removed from the gate corner, so that the drain corner sees a substantially smaller electric field from the gate voltage. That is, the transition into the heavily-doped (typically 1E19 per cc) drain region, when LDD regions are not used, occurs in close physical proximity to the maximum of the gate-induced electric field (at the gate corner), so that mere physical separation of the high-low junction at the LDD/drain boundary is itself advantageous. Third, the LDD region itself will typically be lightly enough doped to impose a slight additional IR voltage drop between the channel and drain, and, although this voltage drop degrades device performance, it does provide a further slight reduction (e.g. a volt or so) in the voltage drop at the LDD/channel boundary. Fourth, the wider physical separation of the source and drain supplies a slightly larger punch-through voltage. Fifth, the LDD reduces the capacitive loading seen by the gate and thus tends to improve the speed of operation.

Where a double implant is used, the respective energies would preferably be selected to give the same stopping distances for the phosphorus and the arsenic implant. In this case, the total dopant concentration within the LDD region can be selected to be in up the neighborhood of 1E18 per cubic centimeter. However, as noted, the resistivity (dopant concentration) of the LDD regions can be varied to optimize the present invetnion for parcicular desired circuit constraints. That is, a lower dosage LDD implant will provide a more gradual dopant profile at the LDD/channel boundary, and therefore a reduced peak electric field at this boundary, but the price for this is degraded transconductance and series resistance.

If a double implant (phosphorous plus arsenic) is used, the first of these effects is increased, as noted above. The second and third can be reduced. That is, where a phosphorus plus arsenic implant is used to form the LDD regions, a slightly higher total dopant concentration within the LDD regions can be used than would be possible with a phosphorus implant only, and a series resistance degradation due to the high resistivity LDD regions can be minimized.

Figure 2:
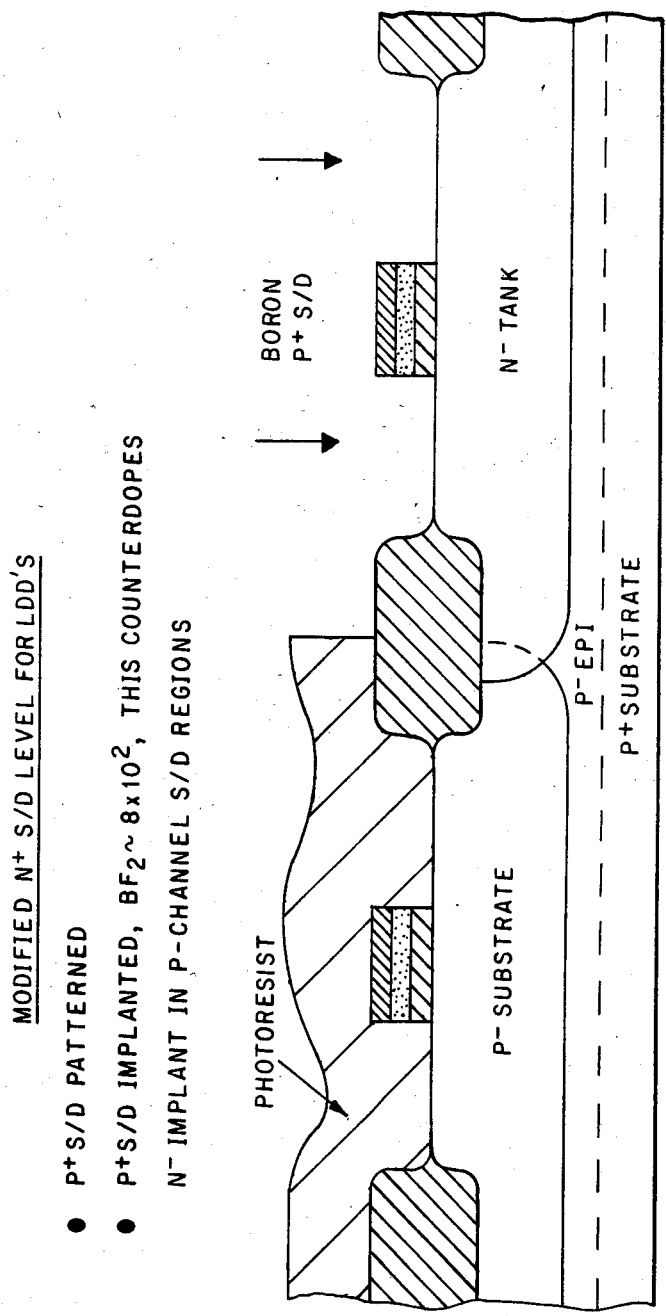

The P+ source/drain is then patterned, while the poly gate photoresist is still in place. The heavy P+ BF$_2$ implant, e.g. $8 \times 10^{15}$/cm$^2$ at GF keV, is then performed (FIG. 2). (This counterdopes the N− which is present in the P+ source/drain region.)

Figure 3:
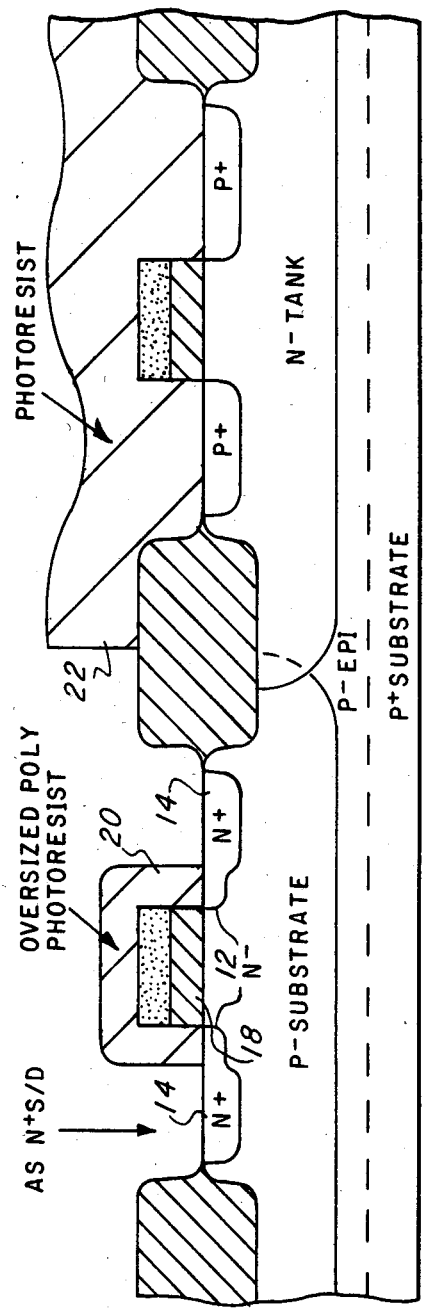

The photoresist is then stripped and the N+ source/drain patterned. However, this time the N-channel source/drain mask is a combination of the old N+ source/drain mask plus an oversized version (1.25 micron/edge or two alignment tolerances) of the poly gates that are outside the tank, i.e. N-channel poly. The heavy arsenic source/drain implant, e.g. $1 \times 10^{16}$/cm$^2$ at 100 keV, then takes place (FIG. 3). The resulting N-channel device therefore has N-type extensions (the LDD regions 12) between the N+ source/drain region 14 and the edge of the N-channel 18 poly gate 20.

The alignment of the mask which patterns the N+ source/drain photoresist 22 has a critical relation to the mask which patterns the polysilicon gate 20. That is, if no LDD region exists between the channel and the drain region 14, the device will not be functional at high voltages. It is due to this requirement that the photoresist mask 22 is made wider than the polysilicon gate 20 by two alignment tolerances, since, in a worse case, the poly mask could have been displaced by one alignment tolerance in one direction and the N+ source/drain mask could be displaced by one alignment tolerane in the opposite direction. Thus, in the preferred embodiments, the length of the LDD region is not selected for its inherently desirable characteristics (quite the opposite), but merely to make absolutely certain that the gradual doping transition at the LDD/channel boundary is in fact located between the drain/LDD transition and the channel. However, in other embodiments of the invention, for extreme high voltage operation (e.g. 40 volts), if degraded series resistance and transconductance were acceptable, then the photoresist mask portion 22 which overlies the polysilicon gates 20 could be enlarged, so that the LDD regions were longer. This would impose greater series resistance, and further separate the source/drain regions 14 from the gate edge.

Figure 4A:
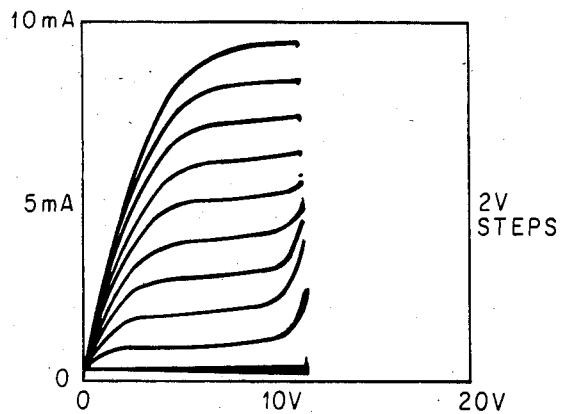
FIGS. 4A, 4B, and 4C show curve tracer plots for actual 4-micron channel length devices, showing that a 4 micron device with a simple arsenic drain implant breaks down at 13 volts drain voltage (FIG. 4A), showing that an N-channel lightly doped drain device formed according to the present invention withstands 20 volts (FIG. 4B,) and also providing a curve tracing of a P-channel device formed by the CMOS process of the present invention for comparison (FIG. 4C).
Figure 4B:
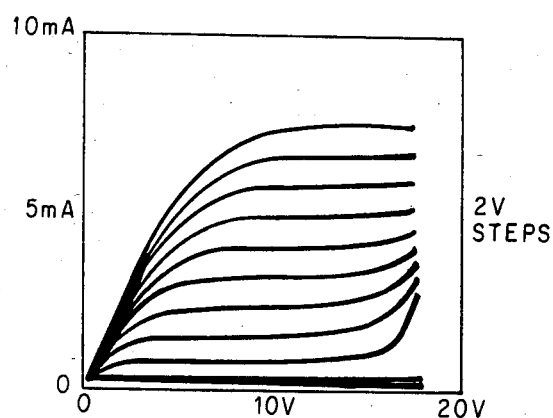
Figure 4C:
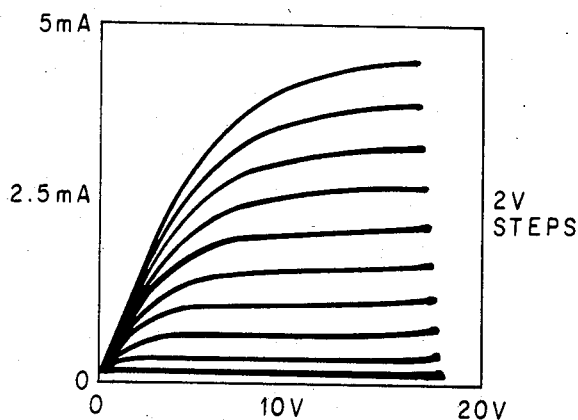
Figure 13:
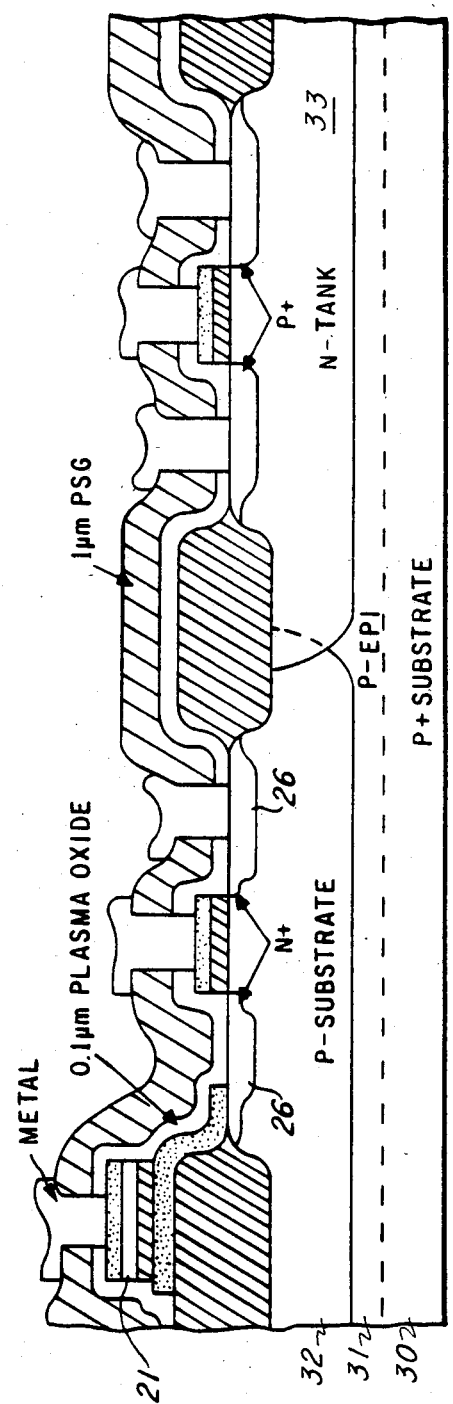

The effectiveness of this technique for permitting short gate lengths (4–5 micron) to be used at high voltages has been demonstrated by both device and circuit operation. FIG. 4A shows a 4 micron N-channel device fabricated by CMOS parallel flow without source/drain extensions. Although the intrinsic junction breakdown is 25 V, gate field induced drain breakdown 12 occurs at 13 V. By including the N− source/drain extensions 12 a much higher breakdown voltage of 20 V is realized. FIG. 4B illustrates that 4 micron devices with N− extensions 12 (FIG. 3) can be safely used at 18 V, and by reducing the LDD implant would be suitable for 20 V applications. The main tradeoff with incorporating LDD extensions is the increased series resistance. This is reflected in an increase in $V_DSAT$ (drain resistance) and a decrease in $g_{m(SAT)}$ (source resistance). These characteristics can be observed by comparing FIGS. 4A and 4B. FIG. 4C shows the P-channel characteristics.

An advantage to using the N+ source/drain photolithographic step to define the N− extension region is that the circuit designer has the flexibility to choose which N-channel devices will incorporate LDD's. This can be accomplished by coding such gates on a separate level and merging that level, rather than the regular N-channel poly gate level, with the N+ source/drain mask. All other devices, i.e. the low voltage devices, will be fabricated with the standard process (i.e. without N− extensions) and will not be subjected to increased source/drain resistance, etc. Note that the low voltage devices need not be long-channel devices. Thus, for example, 4 micron 18 volt devices, having LDD regions in the NMOS devices only, can be integrated with 1½ micron 5 volt conventional CMOS device structures.

Disadvantages of using the N+ source/drain photolithographic step for defining LDD's are that the N+ source/drain level is a critical alignment, and that the extension must be two alignment tolerances wide, adding more series resistance than desirable. Furthermore, the impact on device characteristics of misaligning the source/drain N− extension level must be considered. The result of misalignment is a slight change in how the total series resistance is split between the source and drain. Some small variation in device characteristics can therefore be expected, since more source resistance will decrease gm while more drain resistance will increase $V_{DSAT}$. For devices having gate lengths more than 3 microns, these variations are probably acceptable. However, for gate lengths less than 3 microns, a technique that is alignment insensitive must be used. The present invention is therefore not applicable to gate lengths of less than 3 microns.

The high voltage CMOS process with which the preferred embodiment of the present invention is embodied will now be described in detail. The LDD formation according to the present invention can also be used with other high voltage CMOS processes, but the combination of LDD formation according to the present invention with the high-voltage process described has substantial advantages. In particular, the present invention provides denser devices at the same operating voltage at the same density.

It should be noted that, while the channel length is decreased by the use of LDD extensions, the other operating parameters remain the same. That is, such parameters as P+ to tank edge spacing are not affected by the introduction of the LDD extension regions.

The present invention will be described with primary reference to a process which is optimized for a device which will operate at 18 volts, so that breakdown voltages and field thresholds of 20 volts or better are required. In this preferred embodiment, 4 micron design rules are used. However, the present process also scales directly to lower voltage operation at smaller geometries, for example to 15-volt operation at 3 micron geometries.

The present invention preferably uses a P(30)-on-P+(31) structure (FIG. 5), with both a P-well (32) and an N-tank (33) being implanted within the P-epitaxial layer 31 (FIG. 7).

The present invention permits a 9 mask double-poly process using positive resist, or a 10 mask process using negative resist (since two masking steps are used to form the contact level). Algorithmic mask generation reduces the number of drawn levels to 8, and permits contact to the tank to be made using the N+ source/drain implant, and contact to the P-well using the P+ source/drain implant. The N+ and P+ S/D masks are both generated from a drawn N+/P+ mask and the tank mask. A single-poly process according to the present invention uses only 8 masks. The starting material is a P+ substrate, doped to about $10^{18}$ per cm$^3$, with a 16 micron thick p-type epitaxial layer thereon, doped to about $10^{15}$ per cm$^3$. Evaluation of latchup performance using the process of the present invention indicates that 16 micron epi gives adequate latchup protection for 15 volt operation of internal circuits. For I/O circuits, further protection can be achieved by the addition of guard rings which are implanted with the N+ source/drain implant. Although this requires the use of metal jumpers in the I/O circuits to permit a poly line to cross between P and N channel devices, the area penalty is very small as a percentage of chip size. By providing guard ring structures only in the I/O circuits, which are more likely to receive externally generated high-voltage transients, good resistance to high-voltage transients is provided without significantly increased process complexity or area inefficiency.

Two layers of poly are used, with a regrown gate oxide. The first polysilicon level can be doped by ion implantation, and is therefore suitable for capacitor bottom plates and for natural $V_T$ transistors. In addition, resistors can be formed in this first poly level. The second level of polysilicon is used for regular gates and interconnects. It is this level of polysilicon which provides the gates to which the LDD regions of the N-channel high-voltage transistors are self-aligned. This level is preferably silicided by the coevaporation of titanium and silicon, so that the sheet resistance of the second poly layer is effectively reduced to around 5 ohms per square. This avoids the difficult compromise between resistivity and etching characteristics which is otherwise necessary. When polysilicon is POCl$_3$ doped to below about 50 ohms per square, plasma etching tends to proceed selectively along grain boundaries, in effect removing the polysilicon in chunks. Polysilicon having 50 ohms per square sheet resistance is bad enough for circuit design, but portions of the poly may be exposed to the P-type source/drain implant, and would therefore have an even higher sheet resistane. Siliciding the second poly level avoids the sheet resistance problem, and siliciding by means of co-deposition of titanium and silicon adds almost no additional process complexity.

The final P-channel (N-tank) surface concentration is around $10^{16}$ per cm$^3$, and the tank depth is about 4 microns. With a gate oxide thickness of 70 nm, the resulting body effect is about 1.47 V$^{\frac{1}{2}}$, and the Kp is 5 microamps per volt$^2$. For the majority of circuit designs, the high P-channel body effect is not an issue, since the N-tank can always be returned to the source.

The final N-channel (P-well) surface concentration is around $2 \times 10^{15}$ per cm$^3$, with a resulting body effect of 0.4 V$^{\frac{1}{2}}$ and Kp of 16 microamp per volt$^2$.

A blanket boron implant is used to simultaneously set the $V_{TN}$ (the NMOS threshold voltage) and $V_{TP}$ to plus and minus 1.5 volt. A blanket implant can be used to symmetrize the PMOS and NMOS threshold voltages at only one voltage level, and plus and minus 1.5 volts happen to be paired values conveniently available with the process parameters specified.

The PMOS and NMOS field thresholds are both around 22 volts or greater. This is achieved with a 1.1 micron field oxide, and a blanket boron field threshold adjust implant. The initial field threshold in PMOS regions is higher than required, and the threshold adjust implant dose is selected to equalize the field threshold in PMOS and in NMOS regions. With doping levels as described above, the field threshold levels are equalized at around 22 through 25 volts. Thus, no masking step is required for field threshold adjustment.

The PMOS and NMOS source/drains are implanted with boron and with phosphorus/arsenic respectively, yielding junction depths around 0.75 micron with junction breakdown voltages around 23 volts.

The mask set of the preferred embodiment is therefore as follows:

TABLE 1

| Twin Tub, 15 V, Two-Level Poly CMOS - Mask Set | |
|---|---|
| Mask Name | Function |
| 1. Tank | Defines P-channel regions and can be used for resistors. |
| 2. Moat | Defines moat pattern for active devices and N+ guard rings for I/O circuits. |
| 3. Poly 1 | Used for precision capacitor bottom electrodes interconnect and natural $V_T$ transistors. |
| 4. Poly 2 | Used for regular transistors, capacitor top electrodes and interconnect. |
| 5. N+ S/D | N-channel S/D, N+ guard ring for I/O circuits and tank contact. |
| 6. P+ S/D | P-channel S/D and local P-substrate contact. |
| 7. CTOR | Contact to all poly gates and moat. |
| 8. Metal | Full level of interconnect. |
| 9. POR | Protective overcoat. |

The baseline process flow for the high voltage CMOS process is illustrated in FIGS. 1–8. Starting material is a P+ substrate, doped to about $10^{18}$ per cm$^3$, with a 16 micron epitaxial P-type layer, doped to around $10^{15}$ per cm$^3$. The thickness of the epitaxial layer is controlled by several factors: First, the thicker the layer, the less effective it will be in suppressing latchup; second, the minimum thickness of the epi-layer is determined by the supply voltage, such that with the N-tank at $V_{DD}$ (+15 V) and the P-substrate (epi) at 0 V, the depletion region extending from the tank does not quite reach the P+ substrate. This minimizes the depletion region extending into the tank, thereby increasing the P+ punch thru voltage, and ensures that no voltage is dropped across the P+ substrate which could cause breakdown because of the high fields. Moreover, the thinner the layer, the greater the leakage current and capacitative coupling into the substrate may be.

The epitaxial layer doping is selected as discussed in U.S. patent application Ser. No. 327,661, filed 12/4/81, which is hereby incorporated by reference.

The gain (beta) product of parasitic bipolar transistors produced by the present process is greater than unity, so that avoidance of latch-up depends on never reaching the necessary injection current. This is averted by current leakage through the substrate: the lower the resistance of this leakage path, the more any current surge will be shunted. Lateral spacings which safely avoid latch-up are, in the 15 V case: 5 microns tank-to-N+, and 7 microns tank-to-P+. These scale directly with device geometry.

Referring to FIG. 5, a 50 nm initial oxide 34 is grown, and 140 nm of silicon nitride 35 is deposited. These layers are etched using the tank-complement image (photoresist layer 36), and the N-tank is implanted, using e.g. $5 \times 10^{12}$ per cm$^2$ of phosphorus at 80 l keV.

An oxide 37 (FIG. 6) of e.g. 530 nm is grown in the N-tank region to act as a mask against the P-well implant which follows, and to act as a locater for subsequent alignments. The P-well region 39 is then implanted with boron, at e.g. $4 \times 10^{11}$ per cm$^2$ at 60 keV.

The tank oxide 37 is stripped and the N-tank and P-well implants are driven in. A standard pad oxide 40 (FIG. 7) is grown and nitride 41 is deposited. The moat-complement image is cut in the nitride/oxide stack, and a blanket boron channel stop implant is performed, of e.g. $1.2 \times 10^{13}$ per cm$^2$ at 90 keV.

The photoresist 42 is then stripped, and field oxidation is performed to yield an oxide 43 (FIG. 8) thickness of about 1.2 microns. The nitride (40)/oxide (41) stack over the moat regions is then stripped. A desirable side effect of the field oxidation step is that the boron blanket channel stop implant can be used to raise the N-channel field threshold without overly reducing the P-channel field threshold, since the phosphorus concentration in the N-tank accumulates at the surface during the field oxidation step, whereas much of the boron in the P-well is leached into the oxide. Moreover, for the P-channel devices $Q_{SS}$ (the charge trapped in the oxide), which is always positive, increases the field threshold. This effect is particularly favorable for thick oxides, where the oxide capacitance $C_{OX}$ is necessarily small, since the voltage due to trapped charge in the oxide is $V_{SS} = Q_{SS}/C_{OX}$.

A 25 nm pre-gate oxide (not shown) is then formed, to eliminate the "Kooi effect", and the pre-gate oxide is etched. A first gate oxide 44 (FIG. 8) is then grown to a thickness of 70 nm. Optionally, a first contact pattern may also be etched at this point. A 500 nm thick first poly 45 level is then deposited, and can be doped by using a phosphorus implant, e.g. $5 \times 10^{15}$ per cm$^2$ at 85 keV. This first level of poly is primarily intended as the bottom plate for precision poly-to-poly capacitors, as required in analog signal processing. It may also be used to form natural $V_T$ transistors, and can be used for very short interconnections, since its final sheet resistance inside the N-tank is around 150 ohms per square, and about 40 ohms per square outside the tank. (The difference is due to the counterdoping effect of the boron source/drain implant.) If a first contact is required, it can be included between the moat and first poly level.

The first poly level is then patterned and plasma etched, and the exposed gate oxide is wet etched. Gate oxide 44, also 70 nm thick, is then grown in $O_2 + 5\%$ HCl. Atop the exposed first polysilicon areas, the first poly insulation oxide is simultaneously grown, to 110 nm thick. A boron blanket implant, of e.g. $5 \times 10^{11}$ per cm$^2$ at 40 keV, is used to adjust $V_{TN}$ and $V_{TP}$.

Optionally, for telecommunications circuits where depletion loads may be required (e.g. for source follower circuits), an additional masking step can be included at this stage for a depletion (phosphorus) implant.

A 300 nm thick second poly layer 46 FIG. 10 is now deposited and doped. 200 nm of TiSi$_2$ 47 is deposited by co-deposition of titanium and silicon. Preferably this is done by simultaneous E-beam co-evaporation of titanium and silicon. Alternately, co-sputtering or direct reaction can be used. The titanium silicide is then annealed, and the second poly level is patterned. (Wet etching must not be done after the silicide has been deposited.) The silicide, polysilicon, and exposed gate oxide are then plasma etched. If 2 layers of poly are not required, the second layer may be omitted, and the first poly layer silicided and used for gates.

At this point, the process steps described above to form lightly doped drain extension regions and selected ones of the N-channel transistors begin. That is, the LDD implant (not shown) is applied overall, the P-type source/drain regions are implanted (FIG. 11), and the N-type souce/drain regions are then implanted (FIG. 12), using a mask which offsets the N-type source/drain implant from the channel of the high-voltage N-type transistors. Note that the sequence of the LDD implant, the P+ source/drain implant, and the N+ source/drain implant is not at all critical, and these implants can be performed in any order. However, where N-type polysilicon is used, as is preferred (doped polysilicon) the P-type source/drain implant is preferably performed prior to the N-type source/drain implant, since the resist over the gate layer can be left in place during the first patterned masking operation after the gate patterning operation. That is, if the P-type source/drain implant is performed first, the polysilicon is shielded by its existing resist from counterdoping by the heavy P-type source/drain implant. Where a silicided polysilicon gate level is used, as is presently preferred, the effects of counterdoping are minor.

Note that the formation of lightly doped drain extension regions according to the present invention cannot be performed when source/drain counterdoping is used. Where source/drain counterdoping is possible, it is possible because the unpatterned P-type source/drain implant is compensated by the patterned N-type souce/drain implant. However, the LDD regions do not receive the N-type source/drain implant, and therefore the P-type source/drain implant must be patterned to shield the LDD regions.

The second contact level is then patterned, using two resist coats if negative resist is being used. About a 500 nm thickness is wet etched, and the remainder is plasma etched. Plasma etching is required because of the different etch rates of PSG and plasma oxide.

Finally, 40 nm of plasma polysilicon is deposited, followed by 1200 nm of aluminum. The aluminum is then patterned, etched, and sintered, as shown in FIG. 8. 300 nm of plasma nitride is then deposited. The protective overcoat (POR) pattern is then applied, and the nitride is etched.

The inventive concepts disclosed and claimed herein may also be scaled for other operating voltages. For example, if the present invention is applied to fabricate conservatively rated 20 V circuits: (1) the gate length geometry is set at 4 microns, using LDD implants as described. (2) A thicker field oxide is used, e.g. 1.4 micron, to raise the field threshold. (3) A deeper tank is used, e.g. 5 microns. (The tank dose and drive-in time are commensurately increased, to retain the same surface concentration.) (4) A thicker epi layer is used, e.g. 18-20 microns. (5) Deeper source/drains are used, e.g. 1-1.25 micron deep. (6) A thicker gate oxide can be used, e.g. 80 nm. The above parameters are interdependent, and may all be varied within the inventive process as claimed.

Adaptation of the present invention to even higher-voltage circuits (more than 22 volts) requires that the tank doping be lowered, to improve the junction breakdown of the source/drain junctions in the tank. This in turn requires other changes, such as a disproportionately deeper tank, a slightly lower channel stop dose, and a disproportionately thicker field oxide.

The present invention has been described with primary reference to a double-well epitaxial structure. However, it will be obvious to those skilled in the art that the present invention can also be applied where different means of preventing latch-up are used. For example, N-wells doped to about $10^{16}$ cm$^{-3}$ could be used in a substrate doped to $2\times10^{15}$ cm$^{-3}$ P-type. Although guard rings would be used in this case, the invention can be otherwise practiced or described above.

The present invention is also applicable to N-on-N+ CMOS processing, in which case the LDD regions are incorporated in the NMOS devices within the tanks.

Since a mask is used to selectively form LDD regions in the N-channel devices, a further embodiment of the invention forms lightly doped drain extensions as the drain side only and not on the source side, of the high-voltage devices. It is only near the drain boundary that impact ionization is a hazard, so LDDs on the source side are not necessary. By omitting them, the source component of series resistance is eliminated and the degradation of transconductance is avoided. This capability is a substantial advantage of the present invention over nonselective methods such as sidewall oxide or gate-sidewall-undercut methods.

As will be obvious to those skilled in the art, the present invention will be practiced with a wide range of modifications and variations, and is not limited except as specified in the accompanying claims.

What is claimed is:

1. A method for fabricating CMOS integrated circuits, comprising the steps of:
    providing a semiconductor substrate having a first conductivity type;
    defining a plurality of moat regions on the surface of said substrate;
    introducing impurities into the surface of said substrate, to form a plurality of second-type tank regions;
    depositing and patterning a first insulated conductive layer to define gates in selected first locations;
    introducing a small concentration of an N-type impurity to form P-channel source/drain regions in selected second locations;
    forming a masking layer to cover selected P-channel devices, and also to cover portions of said first insulated conductive layer in at selected third locations to form high-voltage N-channel transistors, said masking layer being wider than said portions of said first insulated conductive layer at said said selected third locations, whereby said masking layer covers portions of said substrate horizontally adjacent to said portions of said first insulated conductive layer at said selected third locations;
    introducing a large concentration of an N-type dopant into a selected set of said second locations, said set including the set of locations horizontally adjacent to said third locations, to form N-type source/drain regions;
    whereby portions of said small-concentration introduction of N-type impurities form lightly doped regions in said set of locations horizontally adjacent to said third locations between the respective channel regions of said high-voltage N-channel transistors and said respective source/drain regions thereof;
    wherein said high-voltage N-channel transistors each comprise a channel length which is not less than 3 microns.

2. The method of claim 1, wherein said first N-type introduction of impurities comprises implantation of phosphorus to provide a concentration not greater than 1E18 per cubic centimeter.

3. The method of claim 1, wherein said introduction of N-type impurities comprises implantations of both phosphorous and of arsenic, said phosphorus implantation being performed to yield a surface concentration on said substrate of not greater than 3E17 per cc,
    said phosphorous and arsenic implantations having approximately the same stopping distance in said substrate,
    said phosphorous and arsenic implantations providing a total concentration of phosphorous and arsenic which is not greater than 2E18 per cubic centimeter.

4. The method of claim 3, wherein said substrate comprises silicon and said first insulated conductive layer comprises polysilicon over silicon dioxide.

5. The method of claim 1, wherein said substrate comprises silicon and said first insulated conductive layer comprises polysilicon over silicon dioxide.

6. The method of claim 1, wherein said substrate comprises an epitaxial lightly doped layer of a first conductivity type over a very heavily doped substrate layer of said first conductivity type, said second-type tank being formed entirely within the thickness of said epitaxial layer.

7. The method of claim 6, wherein the thickness of said second-type tank is less than ½ of the thickness of said epitaxial layer.

8. The method of claim 7, wherein said first conductivity type is P-type, and wherein the depth of said P-type source/drain regions is less than ⅓ of the depth of said second-type (N-type) tank.

9. The method of claim 1, wherein said LDD regions in said N-channel high-voltage transistors comprise an average length of at least two microns.

10. The method of claim 1, wherein N-type impurities are implanted to form N-tank regions and P-type impurities are implanted to form P-well regions within said epitaxial layer, prior to said steps of gate patterning and source/drain formation.

* * * * *